(12) United States Patent
Ryu et al.

(10) Patent No.: US 8,014,207 B2
(45) Date of Patent: Sep. 6, 2011

(54) NONVOLATILE MEMORY DEVICE AND METHOD OF OPERATING THE SAME

(75) Inventors: Seung Han Ryu, Gwangju (KR); Joong Seob Yang, Gyeonggi-do (KR); Seung Jae Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 12/649,742

(22) Filed: Dec. 30, 2009

(65) Prior Publication Data
US 2010/0182830 A1 Jul. 22, 2010

(30) Foreign Application Priority Data

Jan. 21, 2009 (KR) .......................... 10-2009-0005067

(51) Int. Cl.
*G11C 16/06* (2006.01)
(52) U.S. Cl. ............ 365/185.2; 365/185.18; 365/189.07
(58) Field of Classification Search ................ 365/185.2, 365/185.18, 185.23, 185.12, 189.07, 189.09
See application file for complete search history.

(56) References Cited

U.S. PATENT DOCUMENTS

| 5,406,627 | A  | * | 4/1995 | Thompson et al. | 380/237 |
| 6,591,385 | B1 | * | 7/2003 | Krech et al. | 714/718 |
| 7,007,852 | B2 | * | 3/2006 | Silverbrook et al. | 235/487 |
| 7,885,112 | B2 | * | 2/2011 | Li et al. | 365/185.12 |

* cited by examiner

*Primary Examiner* — Gene N Auduong
(74) *Attorney, Agent, or Firm* — IP & T Group LLP

(57) ABSTRACT

A nonvolatile memory device includes an encoder configured to perform a scramble operation on input data, a digital sum value (DSV) generator configured to generate a DSV indicating a difference between a number of data '0' and a number of data '1' in the input data encoded by the encoder, a main cell unit of a page of a memory cell array, wherein the main cell unit is configured to store the input data encoded by the encoder, a spare cell unit of the page, wherein the spare cell unit is configured to store the DSV generated by the DSV generator, and a read voltage setting unit configured to determine a read voltage for the page by comparing a DSV generated from the stored data of the main cell unit and the stored DSV of the spare cell unit.

15 Claims, 5 Drawing Sheets

| DSV difference (offset) | Amount of change in read voltage |
|---|---|
| ... | ... |
| +2% | +AmV |
| ... | ... |
| −0.2% ~ +0.2% | 0mV |
| ... | ... |
| −1.5% | +BmV |
| ... | ... |

NONVOLATILE MEMORY DEVICE AND METHOD OF OPERATING THE SAME

CROSS-REFERENCE TO RELATED APPLICATION

Priority to Korean patent application number 10-2009-0005067 filed on Jan. 21, 2009, the entire disclosure of which is incorporated by reference herein, is claimed.

BACKGROUND

One or more embodiments relate to a nonvolatile memory device and a method of operating the same.

In recent years, there has been an increasing demand for nonvolatile memory devices which can be electrically programmed and erased and which do not require rewriting data at specific refresh intervals.

A typical nonvolatile memory cell of the nonvolatile memory device is configured to enable electrical program/erase operations and to perform the program and erase operations by varying a threshold voltage when electrons are moved by a strong electric field applied to a thin oxide layer.

A typical nonvolatile memory device includes a memory cell array in which cells for storing data are arranged in a matrix form and a page buffer for writing data into specific cells of the memory cell array or reading data stored in a specific cell. The page buffer may include a bit line pair coupled to a specific memory cell, a register configured to temporarily store data to be written into the memory cell array or to read data stored in a specific memory cell of the memory cell array and temporarily store the read data, a sense node configured to sense the voltage level of a specific bit line or a specific register, and a bit line selection unit configured to control whether or not to couple the specific bit line with the sensing node.

The threshold voltages of programmed cells can be changed due to the retention characteristic, disturbance, etc. of a nonvolatile memory device. The nonvolatile memory cell may have a low threshold voltage because electrons stored in the floating gate of the cell are discharged unintentionally due to the leakage current, etc. with a time lapse. A characteristic as to retention of programmed data during a time lapse is referred to as "the retention characteristic." If the retention characteristic is poor, there is a concern in that programmed data may be read differently from the actual programmed data. In particular, when cells have several distributions of the threshold voltages as in a multi-level cell (MLC) program method, such a concern regarding the retention characteristic may become more noticeable because the read margin between the cells is relatively small. Furthermore, threshold voltage distributions of the cells can be changed by disturbance in the threshold voltage according to the program, erase, and read operations of neighboring cells.

Accordingly, when a read operation is performed on memory cells, it is desirable to change read voltages in response to a determination of how much threshold voltage distributions have been changed.

BRIEF SUMMARY

Exemplary embodiments relate to a nonvolatile memory device which is capable of variably setting a read voltage by checking a degree in which a threshold voltage distribution is changed. Furthermore, exemplary embodiments relate to read and program methods using the nonvolatile memory device.

A nonvolatile memory device according to an aspect of this disclosure comprises an encoder configured to perform a scramble operation on input data, a digital sum value (DSV) generator configured to generate a DSV indicating a difference between a number of data '0' and a number of data '1' in the input data encoded by the encoder, a main cell unit of a page of a memory cell array, wherein the main cell unit is configured to store the input data encoded by the encoder, a spare cell unit of the page, wherein the spare cell unit is configured to store the DSV generated by the DSV generator, and a read voltage setting unit configured to determine a read voltage for the page by comparing a DSV generated from the stored data of the main cell unit of the and the stored DSV of the spare cell unit.

A program method using the nonvolatile memory device according to another aspect of this disclosure comprises encoding external input data such that a difference between the number of data '0' and the number of data '1' in the input data is minimized, generating a DSV indicating the difference between the number of data '0' and the number of data '1' in the encoded input data, and storing the encoded data in a main cell unit of a page of a memory cell and the DSV in a spare cell unit of the page.

A read method using the nonvolatile memory device according to another aspect of this disclosure comprises, in a page of a memory cell array, using a main cell unit to store data encoded to minimize a difference between the number of data '0' and the number of data '1' and using a spare cell unit to store a digital sum value (DSV) indicating the difference between the number of data '0' and the number of data '1' in the encoded data, performing a read operation on the page using a first reference voltage, generating a DSV from the stored data of the main cell unit, setting a read voltage by comparing the stored DSV of the spare cell unit and the DSV generated from the stored data of the main cell unit, and performing another read operation on the page using the set read voltage when the set read voltage is different from the first reference voltage.

DESCRIPTION OF EMBODIMENTS

Hereinafter, exemplary embodiments of the present disclosure will be described in detail with reference to the accompanying drawings. The figures are provided to allow those having ordinary skill in the art to make and use the embodiments of the disclosure.

Figure 1:
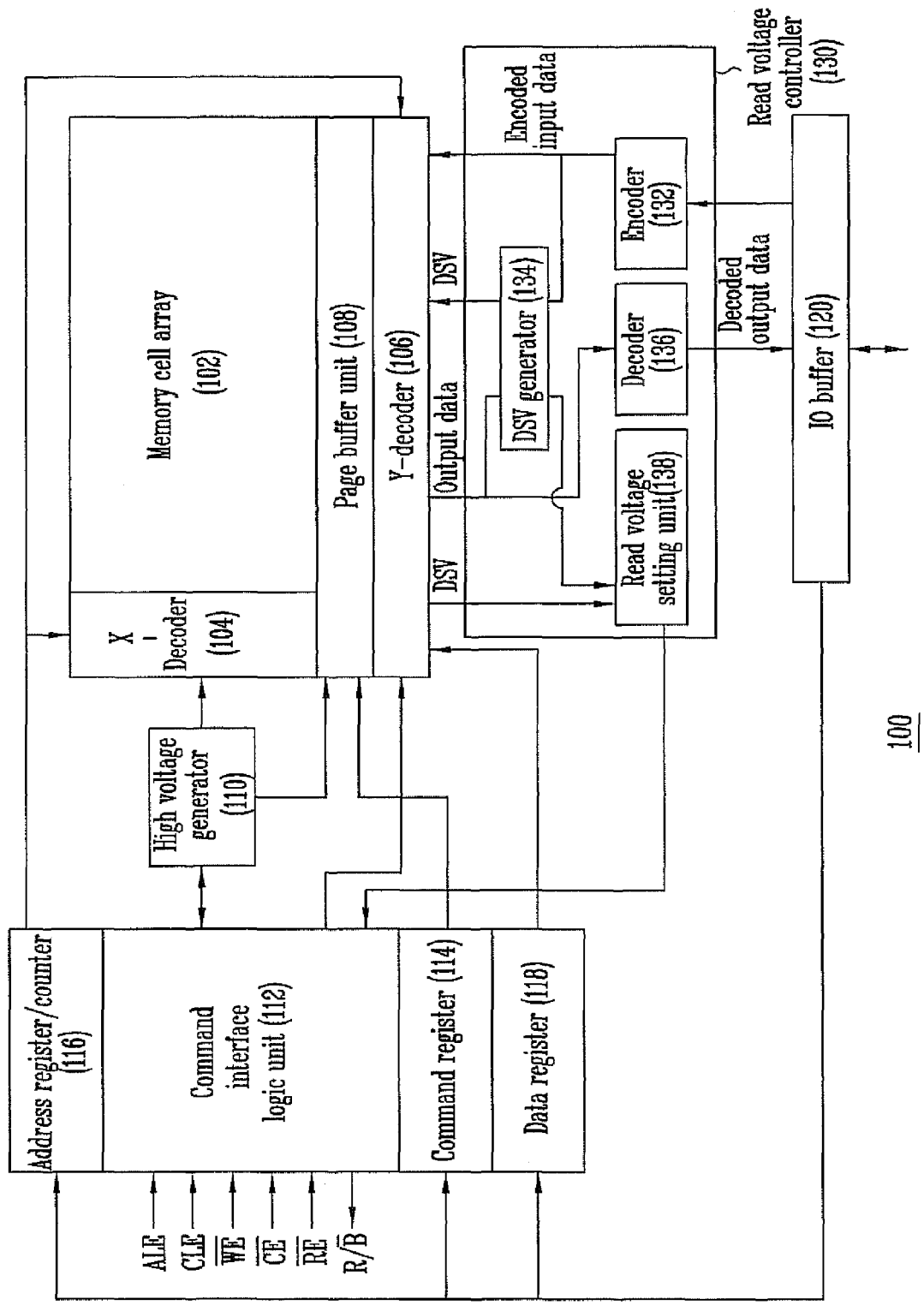
FIG. 1 is a diagram showing an overall construction of a nonvolatile memory device to which this disclosure is applied.

FIG. 1 is a diagram showing an overall construction of a nonvolatile memory device to which this disclosure is applied.

The nonvolatile memory device 100 includes a memory cell array 102, a page buffer unit 108, X and Y decoders 104 and 106, a high voltage generator 110, a command interface logic unit 112, a command register 114, an address register/counter 116, a data register 118, an IO buffer 120, and a read voltage controller 130. The operations of the nonvolatile memory device are described below.

First, when an activated chip enable signal $\overline{CE}$ is applied to the command interface logic unit 112 and a write enable signal $\overline{WE}$ is toggled, the command interface logic unit 112 receives a command signal via the IO buffer 120 (the command register 114 also receives the command signal via the IO buffer 120) and generates a program command, an erase command, or a read command in response to the command signal. Here, the command signal includes a page program setup code for determining an operation mode of the nonvolatile memory device. Meanwhile, the operation state signal R/$\overline{B}$ outputted from the command interface logic unit 112 is disabled for a certain period of time. An external memory controller (not shown) receives the operation state signal R/$\overline{B}$ and determines that the nonvolatile memory device is in an operation state, such as a program, erase, or read operation based on the operation state signal R/$\overline{B}$. For example, while the operation state signal R/$\overline{B}$ is disabled, program, erase, and read operations for one page of the memory cell array are executed.

The address register/counter 116 is configured to receive an address signal through the IO buffer 120 and generates a row address signal and a column address signal. The address signal corresponds to one of the pages included in one of memory cells. The data register 118 is configured to temporarily store various data received via the IO buffer 120 and to transfer them to the Y decoder 106.

The high voltage generator 110 is configured to generate bias voltages in response to the program command, the erase command, or the read command and to supply the bias voltages to the page buffer unit 108, the X decoder 104, etc.

The X decoder 104 is configured to supply one of the blocks of the memory cell array 102 with the bias voltages, supplied from the high voltage generator 110, in response to the row address signal. The Y decoder 106 is configured to supply the data signal to bit lines (not shown) shared by the blocks of the memory cell array through the page buffer unit 108 in response to the column address signal.

The page buffer unit 108 includes a plurality of page buffers configured to latch a data signal received through the IO buffer 120 and then through the Y decoder 106 and to output the latched data signal to the bit lines (not shown) shared by the blocks of the memory cell array 102. Furthermore, each of the page buffers is configured to store data read from the memory cell array according to a read operation and to output the read data externally through the Y decoder 106 and then through the IO buffer 120.

The read voltage controller 130 is configured to perform an operation for varying a read voltage according to the state of a memory cell. To this end, the read voltage controller 130 includes an encoder 132, a digital sum value (DSV) generator 134, and a read voltage setting unit 138. The encoder 132 is configured to reduce a difference in the number of data '0' and data '1' in the encoded data by performing a scramble operation on input data received from the IO buffer 120. The DSV generator 134 is configured to generate a DSV, indicative of a difference in the number of data '0' and '1', from the input data scrambled by the encoder 132 and to transfer the generated DSV to the page buffer unit 108. The read voltage setting unit 138 is configured to calculate a DSV in output data received from the page buffer unit 108 after a read operation is performed and to determine a read voltage for a corresponding memory cell by comparing the calculated DSV and a DSV outputted from the page buffer unit.

The encoder 132 is configured to minimize a difference in the number of data '0' and '1' by scrambling the input data received from the IO buffer 120. Here, the data '0' means that a corresponding cell is a target program cell, and the data '1' means that a corresponding cell is a target erase cell. The encoder 132 performs an encoding operation by performing an XOR operation on the input data. In this case, the encoded input data are stored in a main cell of the memory cell array.

The DSV generator 134 is configured to generate a difference in the number of data '0' and '1' (i.e., a DSV) in the encoded input data. The generated DSV is stored in a spare cell of the memory cell array. The DSV generator 134 preferably is configured to generate information about which one of the number of data '0' and the number of data '1' is larger and to subtract a smaller of the two from the other. The DSV generator 134 is further configured to generate a DSV in output data that are received from the main cell via the page buffer unit 108 and the Y decoder 106. Accordingly, the DSV generator 134 can compare the DSV stored in the spare cell and the DSV directly generated from the output data.

The construction of the main cell and the spare cell is described in detail below with reference to FIG. 2.

Figure 2:
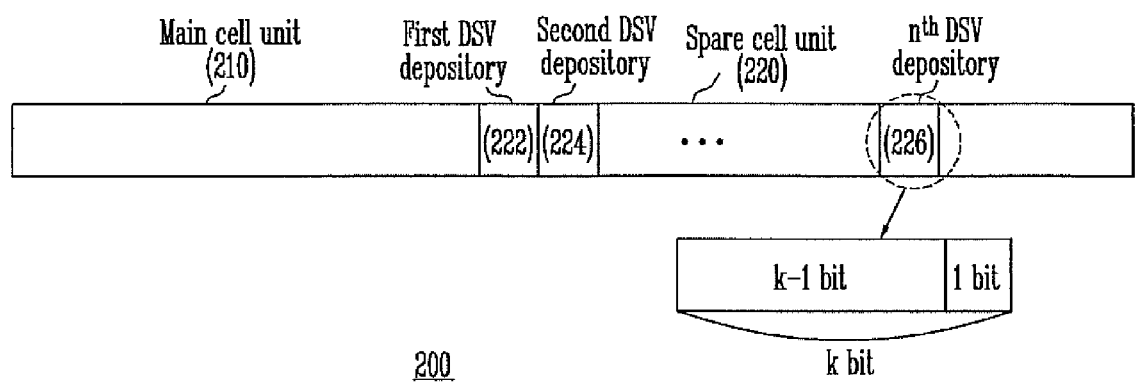
FIG. 2 is a diagram showing the construction of a memory cell array of the nonvolatile memory device according to an embodiment of this disclosure.

FIG. 2 is a diagram showing the construction of a memory cell array of the nonvolatile memory device according to an embodiment of this disclosure.

The memory cell array 200 is a page (i.e., the unit of a program operation), and it includes a main cell unit 210 and a spare cell unit 220. The main cell unit 210 is configured to store input data received through the IO buffer 120. In particular, in this disclosure, the main cell unit 210 is configured to store input data encoded by the encoder 132.

Furthermore, the spare cell unit 220 is configured to store a DSV of the encoded input data stored in the main cell unit 210. That is, the spare cell unit 220 stores a DSV generated by the DSV generator 134 from the encoded input data. Here, the spare cell unit 220 includes a plurality of first, second, ..., $n^{th}$ DSV depositories (222, 224, ..., $n^{th}$ 226) for storing the DSV. Each of the DSV depositories includes a flag bit (1 bit), indicating which one of the data '0' and '1' is included in the encoded data more frequently, as well as bits (k−1 bits) for storing a difference in the number of data '0' and the number of data '1'. For example, when the number of data '1' is larger than the number of data '0' by three, the flag bit is set to '1', which indicates that the number of data '1' is larger than the number of data '0' as additional information with the indication that the difference in the numbers equal to three. Further, when the number of data '0' is larger than the number of data '1' by four, the flag bit is set to '0', which indicates that the number of data '0' is larger than the number of data '1' as additional information with the indication that the difference in the numbers is equal to four.

The DSV depositories in the memory cell array 200 are configured to store the same DSV received from the DSV generator 134. That is, the first to $n^{th}$ DSV depositories 222, 224 to 226 store the same DSV. Thus, the reliability of read results can be increased. In the case where the DSVs stored in the respective DSV depositories are read, the same value is to be outputted ideally. However, since the spare cell is a nonvolatile cell having the same characteristic as that of the main cell, the DSVs outputted from the respective DSV depositories may also differ from the originally stored value when read. Accordingly, a value of the DSV that occurs most frequently from among the DSVs read from the DSV depositories is determined as a DSV for data stored in the main cell unit 210 of a corresponding page.

Referring back to FIG. 1, a decoder 136 is configured to decode read data received from the main cell unit 210 via the page buffer unit 108 and to transfer the decoded data to the IO buffer 120. Here, the read data corresponds to data which have been encoded by the encoder 132, programmed into the memory cell, and then read by a read operation. Accordingly, a descramble operation for returning the read data to the state before the scramble operation performed by the encoder 132 is performed.

While the read data is desired to be the same as the encoded input data before the encoding, they often end up being different from the original stored data due to the retention characteristic of a memory cell.

The read voltage setting unit 138 reads the data stored in the main cell unit 210, directly generates a DSV (for example, which is generated and used internally within the read voltage setting unit 138) in the read data received via the page buffer unit 108, compares the generated DSV and the DSV read from the spare cell 220, and sets a read voltage based on the difference.

The threshold voltages of programmed cells may vary due to the retention characteristic, disturbance, etc. of a nonvolatile memory device. The nonvolatile memory cell may have a low threshold voltage when electrons stored in the floating gate of the cell are discharged externally due to the leakage current, etc. with a time lapse. When cells have several distributions of the threshold voltages as in a multi-level cell (MLC) program method, deterioration of the reading operation according to the retention characteristic may become more noticeable since the read margin between different states of the cells is relatively small.

Figure 3:
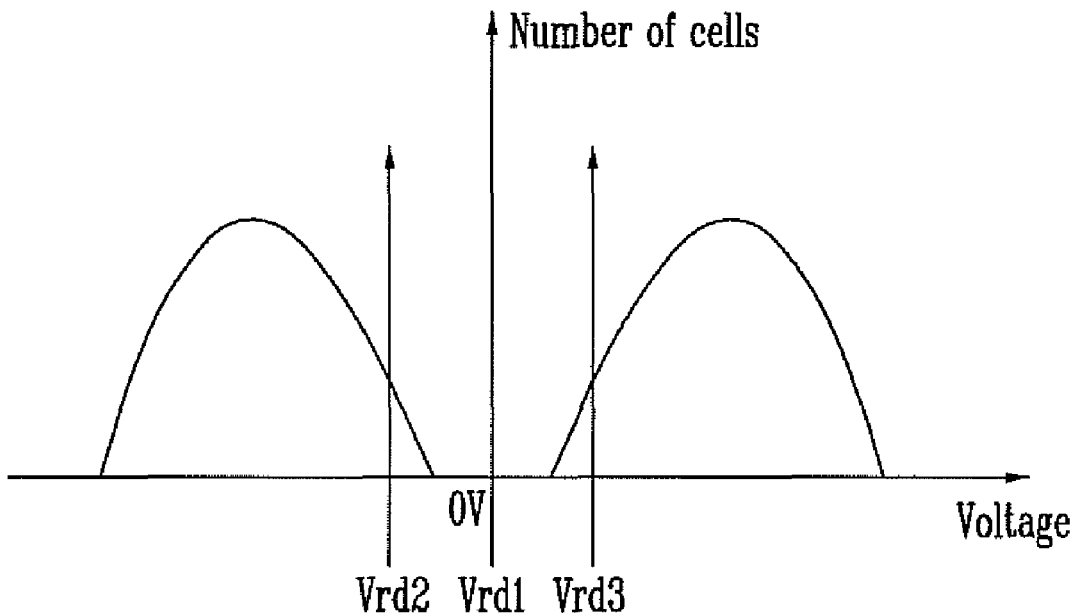
FIG. 3 is a diagram illustrating a method of setting a read voltage of the nonvolatile memory device according to an embodiment of this disclosure.

FIG. 3 is a diagram illustrating a method of setting a read voltage of the nonvolatile memory device according to an embodiment of this disclosure.

In reference to FIG. 1, the read voltage setting unit 138 directly generates a DSV from read data received from the main cell unit 210 via the page buffer unit 108. Such a DSV is referred to as "the DSV of the read data." Furthermore, the read voltage setting unit 138 receives a DSV from the spare cell unit 220 via the page buffer unit 108. Such a DSV is referred to as "the DSV of the spare cell unit," Ideally, the DSV of the read data and the DSV of the spare cell unit is identical with each other. However, they may differ due a change in the retention characteristic, disturbance, and so on.

For example, the DSV of the spare cell unit may indicate that the number of data '0' is larger than the number of data '1' by five after reading of the DSV depositories.

According to another example, the DSV of the read data may indicate that the number of data '0' is larger than the number of data '1' by two. Here, the read data '0' indicates that a corresponding cell has been programmed with a threshold voltage larger than a reference voltage. In such a case, while the number of data '0' may have been larger than the number of data '1' by five when a program was first performed, the number of data '0' has decreased with a time lapse. That is, the threshold voltages of memory cells stored in a main cell decrease due to a change in the retention characteristic. Accordingly, to compensate for such a decrease, a first read voltage (Vrd1) is decreased correspondingly, and a second read voltage (Vrd2) is set as a new read voltage.

According to another example, when the DSV of the read data indicates that the number of data '0' is larger than the number of data '1' by seven, it indicates that the threshold voltages of the memory cells stored in the main cell have been increased due to disturbance of a program operation. Accordingly, to compensate for such an increase, a first read voltage (Vrd1) is increased correspondingly, and a third read voltage (Vrd3) is set as a new read voltage.

According to another example, when the DSV of the spare cell unit indicates that the number of data '1' is larger than the number of data '0' by two.

According to another example, the DSV of the read data may indicate that the number of data '1' is larger than the number of data '0' by five. Here, the read data '1' indicates that a corresponding cell has been erased. Although the number of data '1' was larger than the number of data '0' by two when a program was first performed, the number of data '1' has increased with a time lapse. Such an increase indicates that the threshold voltages of memory cells stored in a main cell have decreased due to a change in the retention characteristic. To compensate for such a decrease in the threshold voltages of memory cells, a first read voltage (Vrd1) is deceased in accordance, and a second read voltage (Vrd2) is set as a new read voltage.

According to another example, when the DSV of the read data indicates that the number of data '0' is larger than the number of data '0' by one, such a read data indicates that the threshold voltages of memory cells stored in the main cell have been increased due to a disturbance of a program operation. Accordingly, to compensate for such an increase, a first read voltage (Vrd1) is increased correspondingly, and a third read voltage (Vrd3) is set as a new read voltage.

However, if there is no significant difference between the DSV of the read data and the DSV of the spare cell unit, an existing read voltage is not changed.

The table of FIG. 3 shows the amounts of change in read voltages according to a difference between DSVs. While the values in the table were statistically obtained through repetitive experiments, they may in practice vary according to the characteristic of each memory cell. The table may be preloaded in the read voltage setting unit 138.

Hereinafter, program and read methods using the nonvolatile memory device are described.

Figure 4:
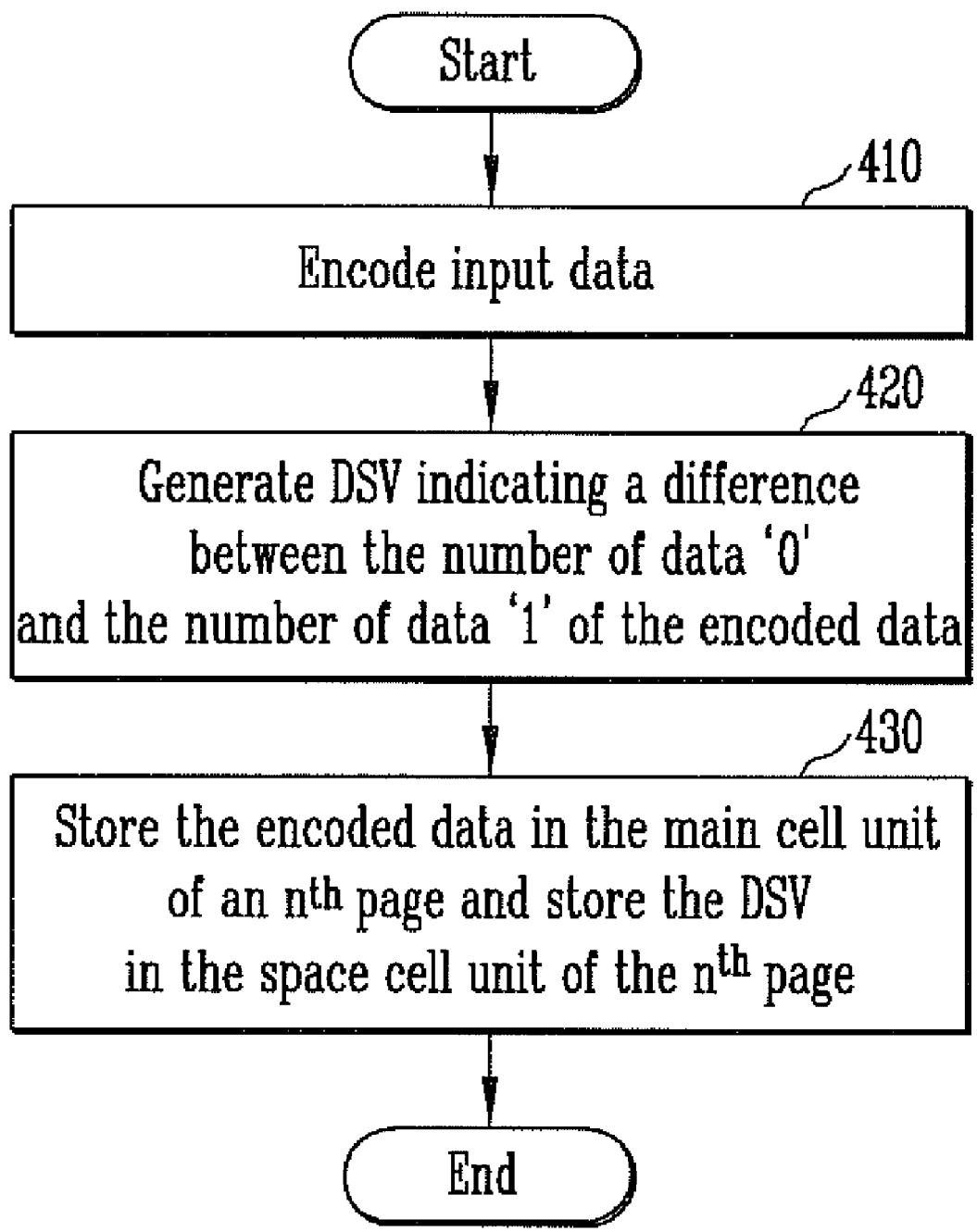
FIG. 4 is a flowchart diagram illustrating a program method of the nonvolatile memory device according to an embodiment of this disclosure.

FIG. 4 is a flowchart diagram illustrating a program method of the nonvolatile memory device according to an embodiment of this disclosure.

First, input data inputted through the IO buffer 120 is encoded at step 410. This step is performed in order to minimize a difference in the number of data '0' and '1' included in the input data. As described above, the number of data '0' and the number of data '1' becomes the same by performing a scramble operation.

Next, a DSV indicative of a difference in the number of data '0' and the number of data '1' of the encoded data is generated at step 420. The DSV includes flag data indicating which one of the number of data '0' and the number of data '1' is larger.

Next, the encoded data are stored in the main cell unit 210 of an $n^{th}$ page and the DSV is stored in the spare cell unit 220 of the $n^{th}$ page through a program operation at step 430. A DSV having the same value preferably is stored in several cells of the spare cell unit 220. In this case, as in the main cell, a program operation using a conventional program method can be performed because a page buffer which is of the same type as that of the page buffer for the main cell is coupled with the spare cell.

As described above, the encoding operation is performed on the input data in order to make the number of data '0' and the number of data '1' to be the same, and a corresponding DSV is stored in the spare cell unit of each page.

Figure 5:
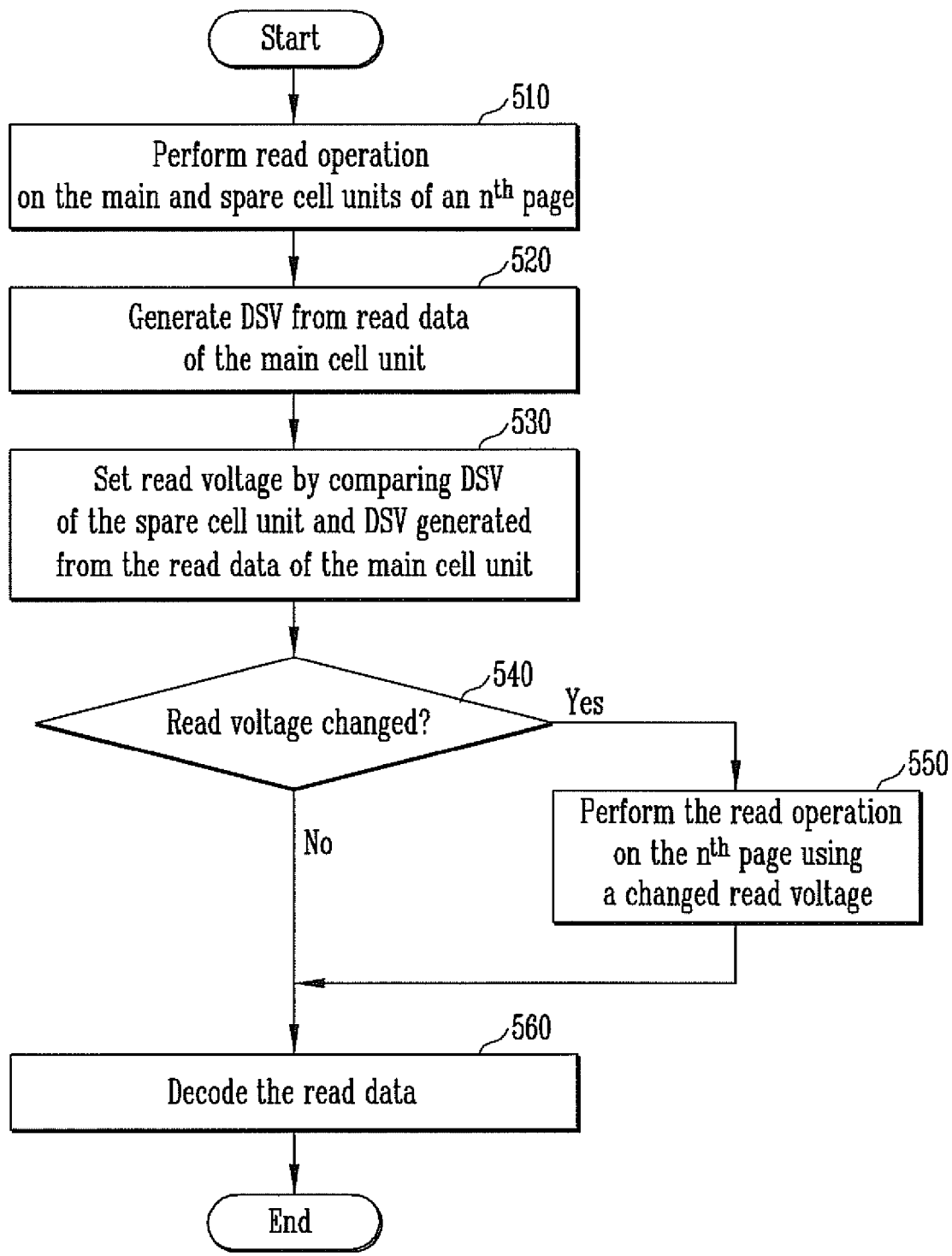
FIG. 5 is a flowchart diagram illustrating a read method of the nonvolatile memory device according to an embodiment of this disclosure.

FIG. 5 is a flowchart diagram illustrating a read method of the nonvolatile memory device according to an embodiment of this disclosure.

First, a read operation is performed on the main cell unit and the spare cell unit of an $n^{th}$ page in which encoded data and a DSV are stored at step 510 according to the program method of FIG. 4.

Since a page buffer is coupled with a spare cell in the same manner a page bugger is coupled with a main cell, data stored in the main cell unit and the spare cell unit can be read through a single read operation.

Meanwhile, a DSV of the $n^{th}$ page is determined by reading the data stored in the spare cell unit. In the case where a plurality of DSVs is stored in the spare cell unit, a DSV that occurs most frequently among the read DSVs is determined as a DSV of the corresponding page. This is because, although the read DSVs may have the same value ideally, they may differ according to different cell characteristics. For example, assuming that a total of 10 DSV depositories are included in the spare cell unit and 7 of the 10 depositories have the same DSV, the most frequent DSV value which is stored in the seven depositories is determined as a DSV of an $n^{th}$ page.

Next, a DSV is generated from the read data of the main cell unit at step 520.

The data stored in the main cell unit are read, the number of data '0' and the number of data '1' in the read data are counted, and a difference between the number of the counted data '0' and the number of the counted data '1' is generated using the DSV generator 134. Information about which one of the number of data '0' and the number of data '1' is larger is generated by subtracting the smaller number from the large number.

Next, the DSV of the spare cell unit and the DSV generated from the read data of the main cell unit are compared with each other, and a read voltage is set based on the comparison result at step 530.

If, as a result of the comparison at step 530, there is no difference between the two DSVs or the difference between the two DSVs falls within a predetermined range, the initial read voltage is kept.

Here, if the threshold voltages of all the cells are determined to have been decreased in view of the difference between the two DSVs, a smaller read voltage is set. In the case where the number of data '1' is determined to have increased (that is, the number of data '0' is determined to have decreased) as a result of the comparison, the threshold voltages of the cells are determined to have been lowered. Here, the read data '0' indicates that a corresponding cell has been programmed with a threshold voltage higher than a reference voltage, and the read data '1' indicates that a corresponding cell is in an erase state.

Meanwhile, if the threshold voltages of all the cells are determined to have been increased in view of the difference between the two DSVs, an increased read voltage is set. In the case where the number of data '1' has decreased (or that the number of data '0') has increased as a result of the comparison, the threshold voltages of the cells are determined to have risen.

On the other hand, an optimal value can be set through repetitive experiments because the amount of change in the read voltage according to a difference between DSVs can be changed according to the characteristic of a memory cell.

It is then determined whether the read voltage has been changed to a new read voltage at step 540.

If, as a result of the determination at step 540, the read voltage is determined to have changed to a new read voltage, the read operation is performed on the $n^{th}$ page again using the new read voltage at step 550. However, if, as a result of the determination at step 540, a determination is made that the read voltage has not changed to a new read voltage, the repeated read operation is not performed.

Next, the read data are then decoded at step 560.

The read data are the data that have been encoded at step 410 of FIG. 4. Here, the encoded data are decoded and outputted through the IO buffer 120. That is, a descramble operation is performed on the encoded data to restore the state of the encoded data before performing the scramble operation at step 410.

As described above, to compensate for a change in the read voltage due to the retention characteristic or disturbance, the read voltage is changed and a read operation is performed.

A read voltage can be changed according to a change in the read voltage of each memory cell. In particular, the read margin between different states of the cells is relatively narrow due to threshold distributions according to an MLC program method. Accordingly, a proper read margin can be secured by varying a read voltage according to exemplary embodiments as described above.

What is claimed is:

1. A nonvolatile memory device, comprising:
   an encoder configured to perform a scramble operation on input data;
   a digital sum value (DSV) generator configured to generate a DSV indicating a difference between a number of data '0' and a number of data '1' in the input data encoded by the encoder;
   a main cell unit of a page of a memory cell array, wherein the main cell unit is configured to store the input data encoded by the encoder;
   a spare cell unit of the page, wherein the spare cell unit is configured to store the DSV generated by the DSV generator; and
   a read voltage setting unit configured to determine a read voltage for the page by comparing a DSV generated from the stored data of the main cell unit and the stored DSV of the spare cell unit.

2. The nonvolatile memory device of claim 1, wherein:
   the data '0' indicates that a corresponding cell is a cell to be programmed, and
   the data '1' indicates that a corresponding cell is a cell to be erased.

3. The nonvolatile memory device of claim 1, wherein the DSV generator is configured to generate the DSV which includes information about which one of the number of data '0' and the number of data '1' in the input data is larger and information as to the difference between the number of data '0' and the number of data '1'.

4. The nonvolatile memory device of claim 1, wherein the read voltage setting unit is further configured to increase the read voltage when the number of data '0' has increased or the number of data '1' has decreased in the DSV generated from the stored data of the main cell as a result of the comparison.

5. The nonvolatile memory device of claim 1, wherein the read voltage setting unit is further configured to decrease the read voltage when the number of data '0' has decreased or the number of data '1' has increased in the DSV generated from the stored data of the main cell as a result of the comparison.

6. The nonvolatile memory device of claim 1, wherein the spare cell unit comprises a plurality of DSV depositories configured to store a same DSV input.

7. A program method using a nonvolatile memory device, comprising:

encoding external input data such that a difference between a number of data '0' and a number of data '1' in the input data is minimized;

generating a DSV indicating the difference between the number of data '0' and the number of data '1' in the encoded input data; and storing the encoded data in a main cell unit of a page of a memory cell array and the DSV in a spare cell unit of the page.

8. The program method of claim 7, wherein generating the DSV indicating the difference between the number of data '0' and the number of data '1', in the encoded input data includes generating information about which one of the number of data '0' and the number of data '1' in the encoded input data is larger and information about the difference between the number of data '0' and the number of data '1' in the encoded input data.

9. A read method using a nonvolatile memory device, comprising:

in a page of a memory cell array, using a main cell unit to store data encoded to minimize a difference between a number of data '0' and a number of data '1' in the encoded data and using a spare cell unit to store a digital sum value (DSV) indicating the difference between the number of data '0' and the number of data '1' in the encoded data;

performing a read operation on the page using a first reference voltage;

generating a DSV from the stored data of the main cell unit;

setting a read voltage by comparing the stored DSV of the spare cell unit and the DSV generated from the stored data of the main cell unit; and performing another read operation on the page using the set read voltage when the set read voltage is different from the first reference voltage.

10. The read method of claim 9, wherein generating the DSV from the stored data of the main cell unit includes generating information about which one of the number of data '0' and the number of data '1' in the stored data of the main cell unit is larger and information about the difference between the number of data '0' and the number of data '1' in the stored data of the main cell unit.

11. The read method of claim 9, wherein setting the read voltage includes increasing the read voltage when the number of data '0' has increased or the number of data '1' has decreased in the stored DSV of the main cell unit as a result of the comparison.

12. The read method of claim 9, wherein setting the read voltage includes decreasing the read voltage when the number of data '0' has decreased or the number of data '1' has increased in the stored data of the main cell unit as a result of the comparison.

13. The read method of claim 9, wherein setting the read voltage includes leaving the reference voltage unchanged when the DSVs are the same or fall within a predetermined range from each other.

14. The read method of claim 9, further comprising:

decoding the stored data of the main cell unit as read through the read operation performed using the first reference voltage when the read voltage is left the same as the first reference voltage in the setting of the read voltage.

15. The read method of claim 9, further comprising:

decoding the read data of the main cell unit read using the set read voltage when the set read voltage is different from the first read voltage.

\* \* \* \* \*